United States Patent
Buelow et al.

(10) Patent No.: US 11,353,506 B2
(45) Date of Patent: Jun. 7, 2022

(54) SAFETY CIRCUIT AND METHOD FOR TESTING A SAFETY CIRCUIT IN AN AUTOMATION SYSTEM

(71) Applicant: WAGO Verwaltungsgesellschaft mbH, Minden (DE)

(72) Inventors: Alexander Buelow, Stadthagen (DE); Christian Voss, Minden (DE); Torsten Meyer, Penningsehl (DE)

(73) Assignee: WAGO Verwaltungsgesellschaft mit beschraenkter Haftung, Minden (DE)

( * ) Notice: Subject to any disclaimer, the term of this patent is extended or adjusted under 35 U.S.C. 154(b) by 329 days.

(21) Appl. No.: 16/599,935

(22) Filed: Oct. 11, 2019

(65) Prior Publication Data

US 2020/0116785 A1 Apr. 16, 2020

(30) Foreign Application Priority Data

Oct. 12, 2018 (DE) ...................... 10 2018 008 109.6

(51) Int. Cl.
| | | |
|---|---|---|
| *G01R 31/28* | (2006.01) | |
| *G01R 31/317* | (2006.01) | |
| *G05B 23/02* | (2006.01) | |
| *H03M 1/10* | (2006.01) | |
| *G01R 31/3183* | (2006.01) | |
| *H03M 1/12* | (2006.01) | |

(52) U.S. Cl.
CPC . *G01R 31/31707* (2013.01); *G01R 31/31712* (2013.01); *G01R 31/318371* (2013.01); *G05B 23/0208* (2013.01); *H03M 1/1071* (2013.01); *H03M 1/1275* (2013.01)

(58) Field of Classification Search
CPC ........ G01R 31/31707; G01R 31/31712; G01R 31/318371; G05B 23/0208; H03M 1/1071; H03M 1/1275
See application file for complete search history.

(56) References Cited

U.S. PATENT DOCUMENTS

| | | | |
|---|---|---|---|
| 7,593,205 B2 | 9/2009 | Veil | |
| 7,613,592 B2 | 11/2009 | Kuhn et al. | |
| 9,319,033 B1* | 4/2016 | Jin | H03K 4/502 |
| 2014/0191890 A1* | 7/2014 | Spinks | H03M 1/109 |
| | | | 341/120 |
| 2019/0131993 A1* | 5/2019 | Bartling | H03M 1/1071 |

FOREIGN PATENT DOCUMENTS

| | | |
|---|---|---|
| DE | 19640937 A1 | 4/1998 |
| DE | 102005011406 A1 | 9/2006 |
| DE | 102005030276 A1 | 12/2006 |
| DE | 102011050539 A1 | 11/2012 |
| DE | 102013111888 A1 | 4/2015 |
| JP | 2003114266 A | 4/2003 |
| JP | 2013113624 A | 6/2013 |

\* cited by examiner

*Primary Examiner* — Christine T. Tu
(74) *Attorney, Agent, or Firm* — Muncy, Geissler, Olds & Lowe, P.C.

(57) ABSTRACT

A safety circuit for the multi-channel processing of an input signal. The safety circuit includes an analog-to-digital conversion device having a first analog input and a second analog input and at least one digital output for processing the input signal. Furthermore, the safety circuit has a test device which is set up to apply a test signal at the first and/or second input of the A/D conversion device in such a way that the test signal superposes the input signal such that the test signal dominates the input signal.

17 Claims, 4 Drawing Sheets

SAFETY CIRCUIT AND METHOD FOR TESTING A SAFETY CIRCUIT IN AN AUTOMATION SYSTEM

This nonprovisional application claims priority under 35 U.S.C. § 119(a) to German Patent Application No. 10 2018 008 109.6, which was filed in Germany on Oct. 12, 2018, and which is herein incorporated by reference.

BACKGROUND OF THE INVENTION

Field of the Invention

The present invention relates to a device and a method for testing a safety circuit, in particular for analog input signals in an automation system.

Description of the Background Art

In automation technology, systems are known in which sensors detect physical quantities, for example, of an environment and convert these into electrical signals. The electrical signals can be transmitted to a controller (PLC) for evaluation. A processor in the controller processes the signals by means of a control program, e.g., for controlling actuators, which execute a process step. The process step can be a sub-process as part of an overall process. In this case, it is necessary to check the correct transmission of the electrical signals from time to time or cyclically to ensure proper operation. Advantageously, the check can take place without interrupting the process. The electrical signals can be present in digital or analog form. If the sensor signals are present in analog form, said signals may be digitally processed and forwarded for further processing in so-called analog-to-digital conversion devices (A/D conversion devices) for further processing, for example for digitizing by a control and evaluation unit. In this case, the A/D conversion device may contain one or more A/D converters.

From DE 10 2013 111 888 A1, a safety device for processing a multi-channel analog input signal is known, in which a test device is in each case connected to a further additional input of a first and a second switching device. The test device is configured to generate defined test signals. For example, the test device can generate test signals by means of a control signal from a microcontroller and supply them via the switching device to the A/D converter, by means of which the entire value range of the A/D converters can be tested. For this purpose, the output signals generated by the A/D converters in response to the test signal are supplied to the microcontrollers and checked for accuracy.

DE 10 2011 050 539 A1 proposes a measuring device with at least two measuring channels, wherein each measuring channel has an A/D converter for converting an analog voltage to a digital voltage value, and a logic unit. A measuring channel is designed as a safe measuring channel and includes a multiplexer, wherein with the multiplexer, the analog voltage can be switched between a measuring voltage and a reference voltage. The logic unit of at least one other measuring channel is designed as a reference creator to provide the reference voltage and to switch the multiplexer between the measuring voltage and the reference voltage.

Furthermore, DE 10 2005 011 406 A1, which corresponds to U.S. Pat. No. 7,613,592, discloses a two-channel method for determining at least one output signal. In this case, two independent channels are provided. The input signals are alternately supplied to these channels, with a multiplexer serving to switch between the channels. A microprocessor in one of the channels provides test input signals which are fed to the channel at which the changing input signals are currently absent. Accordingly, this channel outputs output signals, which are compared with an expected value to check whether this channel is operating properly. At the same time, the other channel is used to produce the output signal. Subsequently, the multiplexer switches on the basis of a control signal. In this case, an A/D converter is arranged in each channel, which converts the analog measurement voltage into a digital voltage value.

SUMMARY OF THE INVENTION

It is therefore an object of the present invention to provide a preferably improved safety circuit.

Accordingly, a safety circuit is provided for multi-channel processing of an input signal, in particular a sensor signal having an input circuit, configured to input the input signal and to provide said input signal at its output.

The safety circuit further comprises an A/D conversion device with a first analog input and a second analog input and at least one digital output.

Furthermore, the safety circuit comprises a first signal line, which is connected to the output of the input circuit and to the first analog input of the A/D conversion device for relaying a first input signal in analog form, wherein the A/D conversion device is set up to convert the first input signal in analog form at the first analog input to a first input signal in digital form and to output it at the at least one digital output.

The safety circuit further comprises a second signal line, which is connected to the output of the input circuit and to the second analog input of the A/D conversion device for relaying a second input signal in analog form, wherein the A/D conversion device is configured to convert the second input signal in analog form at the second analog input to a second input signal in digital form and to output it at the digital output.

The safety circuit also has a control and evaluation device for evaluating the first input signal in digital form and the second input signal in digital form, wherein the at least one digital output of the A/D conversion device is connected to the at least one input of the control and evaluation device.

In addition, the safety circuit includes a test device for outputting an analog test signal, wherein the test device has a control input, which is connected to a control output of the control and evaluation device. The control and evaluation device is further configured to control the test device. In this case it is particularly advantageous that the test device has a first analog test output for outputting the analog test signal, which is connected to the first signal line, and that the test device has a second analog test output for outputting the analog test signal, which is connected to the second signal line.

The safety circuit described in the exemplary embodiment can be, in particular, an electrical device which converts signals from sensors for further processing in the control and evaluation device. The safety circuit also comprises the test device, wherein in an advantageous embodiment of the invention during a test period, the signal lines can be checked for line breakage and/or short circuits and/or the proper operation of the A/D conversion device.

According to an advantageous embodiment, the safety controller can continue to receive sensor signals during the test period, on the basis of which it can control a process and, in case of error, interrupt this process, if appropriate, and/or trigger an error signal.

In terms of the signals provided by sensors, a distinction can be made between digital and analog input signals. While digital signals can be evaluated or processed directly, for example, in a control and evaluation unit, it may be advantageous to process or adapt analog signals. For processing or adapting the analog signals, the safety circuit comprises an input circuit.

For example, an analog signal output from a corresponding sensor may be a voltage representing, for example, a temperature or other physical quantity or a property of the environment.

The operating principle of this type of sensors is based, for example, on the fact that as a function of the measured variable (temperature, length . . . ), the ohmic resistance of the sensor changes. This change in resistance leads to a changed voltage drop at the sensor, which can then be recorded as an analog signal by means of a simple voltage divider or a bridge circuit.

For further processing of the analog signal, so-called A/D converters are advantageous. The A/D converter discretizes a time-continuous input signal (either through its operational principle or through an upstream or integrated sample-and-hold stage) into individual discrete sample values. These sample values are then converted to digital values. Due to a finite number of possible output values, quantization is always carried out.

The result of an A/D conversion is represented, for example, in a signal time diagram as a dot sequence with stepped, horizontal and vertical distances. The main parameters of an A/D converter are its bit depth, its maximum sampling rate, and its oversampling capability. The bit depth and the oversampling of an A/D converter delimit the maximum possible accuracy with which the input signal can be converted. A/D converters today are integrated in microchips and can be designed with one or multiple channels. Multi-channel in this context can mean that, for example, several signals can be relayed or processed almost simultaneously and independently of each other. The A/D conversion devices may include integrated multiplexers, wherein the integrated multiplexers are set up to switch a plurality of channels to an A/D converter, so that for example all channels are switched cyclically one after the other to the A/D converter.

The test device also comprises, for example, a multiplexer having a controllable logic and a switching device having a plurality of switches, which, for example, can be switched independently of each other and preferably can be connected to an external signal source.

The control and evaluation device advantageously can include a computing unit and a memory containing executable programs, wherein the computing unit may be formed of a processor, a microcontroller, or preferably of two microcontrollers.

The programs process the control and evaluation tasks, wherein the programs can be executed on a processor, a microcontroller or on two microcontrollers at the same time, or also separately in accordance with the control and/or evaluation programs.

According to an advantageous development, the test device of the safety circuit has a test input for inputting the analog test signal, wherein at least during a test period, the analog test signal is applied. In particular, a signal source is connected to the test input. The signal source is designed to generate the analog test signal, in particular by means of a voltage or current source.

The test input is suited for receiving and, where appropriate, relaying an advantageously continuous analog signal as an analog test signal. Preferably, the signal source generating the analog test signal is a controllable voltage or current source, which is adapted for outputting voltage or current values predetermined by the control and evaluation devices to be analog test signals.

The analog test signal can be a ground potential or a constant voltage potential or a variable voltage potential.

In a simple case, for example, a transistor can be used as a signal source, which connects the test input to ground. Furthermore, both constant voltage sources and variable voltage sources can be used to output the analog test signal.

The analog test signal can be a constant or variable current.

The analog test signal can follow a predetermined or predeterminable signal path during the test period.

In this context, the analog test signal $S_{TA}$ is constant during the test period ($T_{test}$), i.e., unchanged in time ($S_{TA}$=const.) or follows a signal path as a function F of time ($S_{TA}$=F(t)).

The test device can have a switching device, wherein said switching device is configured to switch the analog test signal to the first analog test output and/or to the second analog test output.

In this case, the switching device may have mechanical and/or electronic switches, in particular semiconductor switches, which can preferably be controlled via a control logic and in the closed state produce an electrical connection in such a way, that the test signal is applied at the analog test outputs.

The switching device can have at least two switches, wherein the switches can be controlled individually and/or in groups.

The control of the switches is carried out by the control logic, wherein the control logic preferably receives digital signals via a control input, for example from the control and evaluation device, and evaluates these so that each switch can be individually switched.

The first signal line of the safety circuit can have a first damping element, so that the input circuit with the interposition of the first damping element is connected to the first analog input of the A/D conversion device. Further, the second signal line has a second damping element, so that the input circuit with the interposition of the second damping element is connected to the second analog input of the A/D conversion device.

The term damping element can be understood to be an electrical component, such as an ohmic resistance or an impedance. The damping element is inserted into the signal path between the input circuit and the first or the second analog input of the A/D conversion device to change the signal downstream of the damping element in the direction of the A/D conversion device, at least during test mode. In this case, the signal can be changed in its amplitude and/or level and/or frequency.

The first damping element, the second damping element and an output impedance of the test device and/or the signal source can be dimensioned such that the first input signal in analog form and the analog test signal at a first analog input of the A/D conversion device are superposed during the test period and/or that the second input signal in analog form and the analog test signal at the second analog input of the A/D conversion device are superposed during the test period such that the analog test signal dominates the first input signal in analog form or the second input signal in analog form.

The control and evaluation device can have a processor for processing the first input signal in digital form and/or the second input signal in digital form.

The processor in the control and evaluation unit, also referred to as a microprocessor, contains all the components, such as an arithmetic logic unit, a control unit, a register and a memory manager in an integrated chip. In this case, the processor may also be a multi-core processor which includes multiple processor cores, in particular, of two processor cores.

The A/D conversion device can have a first A/D converter and a second A/D converter, wherein the first A/D converter is configured to convert the first input signal in analog form to the first input signal in digital form and to output it at the digital output, and wherein the second A/D converter is configured to convert the second input signal in analog form to the second input signal in digital form and to output it at the digital output.

The A/D conversion device can be designed in a multi-channel manner and can include several A/D converters, which can simultaneously convert one or more first and/or second input signals in analog form to first and/or second input signals in digital form. Alternatively, the A/D conversion device can have precisely one A/D converter with an upstream multiplexer, which switches multi-channel first and/or second input signals in analog form, for example, to a A/D converter.

In a further aspect of the invention, a method of testing a safety circuit is provided. The safety circuit includes a signal source for generating an analog test signal and a test device to output the analog test signal. In the method, the analog test signal is output to a first and/or a second signal line, so that during a test period, the analog test signal which is present at an analog input of the test device is connected (distributed) via a switching device in such a way that a first analog input of a first A/D conversion device and/or a second analog input of the A/D conversion device is acted upon with the analog test signal, so that the analog test signal with a first input signal in analog form is superposed at the first analog input of the A/D conversion device and/or that the analog test signal with a second input signal in analog form is superposed at the second analog input of the A/D conversion device.

The signal source is, for example, a signal source which is preferably controllable by means of a processor for outputting a defined analog test signal. In this case, outputting the analog test signal is understood to be connecting a signal line to ground, a constant or variable voltage potential or a constant or variable current to a signal line. The switching device is set up to distribute the analog test signal to the signal lines, wherein the switching device is preferably controlled by means of a processor of the control and evaluation unit.

During the test period, the test device superposes the first input signal in analog form with the analog test signal in such a way that the analog test signal dominates at the first analog input of the A/D conversion device and/or the second input signal in analog form is superimposed with the analog test signal such that the analog test signal dominates at the second analog input of the A/D conversion device.

The dominance of the analog test signal can be optimized by selecting the real or complex impedances of the damping elements and the impedances of the first and second analog outputs of the test device or by using variable impedances.

A test input of the test device can be acted upon by the analog test signal during the test period, wherein the analog test signal is provided by a controllable signal source, in particular a voltage source and wherein the signal source is controlled by a control and evaluation device.

A voltage source used as the signal source may be a DC or AC voltage source to output constant or variable voltage values. Here, in particular controlled or regulated voltage sources are advantageous.

The analog test signal can be changed by automatically following a predetermined or predeterminable signal path.

The change of the analog test signal, for example the magnitude of the voltage value, is preferably on a time basis and may be linear or have another functional relationship with time. Therefrom, other temporal dependencies of the A/D conversion device can also be determined. Advantageously, the range of the voltage values covers at least the operating range of the A/D conversion device.

The method comprises a control and evaluation device, which during the test period checks the test signal output by the test device at the first analog input of the A/D conversion device and/or at the second analog input of the A/D conversion device for converting the analog test signal to the first input signal in digital form against an expected value and triggers an error signal if a disparity is found.

The expected value may be based on a value or a value range corresponding to, for example, a numerical value or a numerical range. The numerical value or numerical range can be used as a comparison value and is dependent on the A/D conversion device or the A/D converters. The numerical value and/or numerical range preferably covers or corresponds to at least the measuring range of the A/D conversion device.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
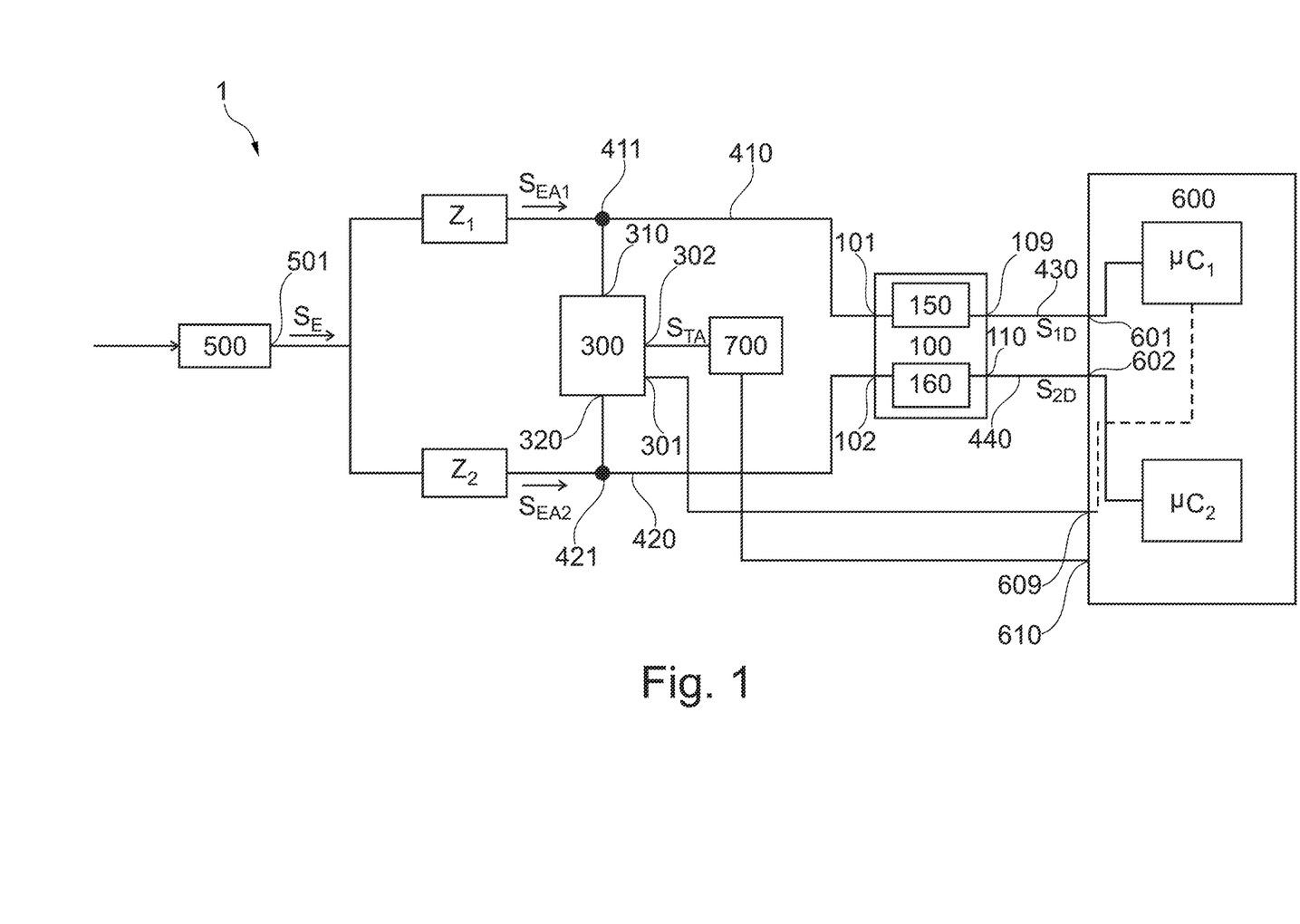
FIG. 1 is a block diagram of a safety circuit of an exemplary embodiment comprising an input circuit, a test device, an A/D conversion device and a control and evaluation unit.

FIG. 1 shows a block diagram of a security circuit 1 of an exemplary embodiment. The safety circuit 1 includes an input circuit 500 for connecting an analog sensor. The input circuit has a matching circuit for outputting a sensor signal $S_E$ at the output 501. A first signal line 410 is connected to the output 501 of the input circuit 500 and to the first analog input 101 of the A/D conversion device 100. Further, a second signal line 420 is connected to the output 501 of the input circuit 500 and to the second analog input 102 of the A/D conversion device 100.

In the first signal line 410, the damping element $Z_1$ is connected in series, so that the sensor signal $S_E$ output from the input circuit 500 at the output 501 is damped.

Further, in the second signal line 420, the damping element $Z_2$ is connected in series, so that the sensor signal $S_E$ output from the input circuit 500 at the output 501 is also dampened.

The damping elements $Z_1$, $Z_2$ and the damping factors derived therefrom are co-determined by their impedances. The first and second input signals in analog form $S_{EA1}$ and $S_{EA2}$ dampened by means of the damping elements $Z_1$ and $Z_2$ are processed in the A/D conversion device 100.

The A/D conversion device 100 as shown in the embodiment of FIG. 1 formed of two A/D converters known from the prior art. The A/D converters 150 and 160 convert the first and second input signals in analog form $S_{EA1}$ and $S_{EA2}$, present at the first and second analog inputs 101 and 102, to first and second input signals in digital form $S_{1D}$ and $S_{2D}$ and output these via a first and a second digital output 109 and 110.

For further processing of the first and second input signals in digital form $S_{1D}$ and $S_{2D}$, the signals are relayed via data lines 430 and 440 to a first and a second input 601 and 602 of the control and evaluation device 600.

The control and evaluation device 600 formed of two microcontrollers μC1 and μC2, each of which is connected with one another and with the inputs 601 and 602 for data processing. The microcontrollers are configured to process the first and second input signals in digital form $S_{1D}$ and $S_{2D}$, wherein the processing may include an evaluation and/or a relaying, for example, to a higher level controller.

As shown in the exemplary embodiment in FIG. 1, the safety circuit 1 has a test device 300, wherein the first analog test output 310 of the test device 300, the first analog input 101 of the A/D conversion device 100 are electrically connected to the damping element $Z_1$ at the node 411. Furthermore, the second analog test output 320 and the second analog input 102 of the A/D conversion device 100 are electrically connected to the damping element $Z_2$ at the node 421.

The test device 300 further comprises a test input 302 for inputting an analog test signal $S_{TA}$. A signal source 700 coupled to the test input 302 serves to generate the analog test signal. The signal source is connected via a control line to the control output 610 of the control and evaluation unit 600 and is configured to set the analog test signal $S_{TA}$ according to a specification given by the control and evaluation device 600.

To control the test device 300, the control input 301 is connected to the control and evaluation device 600. In addition, the test device is set up to switch the analog test signal $S_{TA}$ to the first analog test output 310 and/or to the second analog test output 320 according to a specification given by the control and evaluation unit 600.

The test device is structured in a simple manner (see the exemplary embodiment of FIG. 3) and has a switching logic 360 and a switching device 350 with a number of switches 355, which are controlled by the switching logic and which connect the analog test signal $S_{TA}$ with the analog test outputs according to the specifications of the control and evaluation logic. The low output impedance of the first analog test output 310 and/or the second analog test output 320, as shown in the exemplary embodiment, causes a much larger signal amplitude of the test signal $S_{TA}$ than the signal amplitude of the input signal ($S_{EA1}/S_{EA2}$) such that the analog test signals $S_{TA}$ dominate at the first analog input 101 and/or at the second analog input 102 of the A/D conversion device 100.

With the exemplary embodiment of FIG. 1, a safety circuit is realized in which the signal path can be simply tested, for example, for line breakage, since both the first input signal in analog form $S_{EA1}$ and the analog test signal $S_{TA}$ are guided over a common signal path and are evaluated. Advantageously, the analog signals are subject to the same physical properties. Furthermore, it is possible to test the A/D conversion device 100, in particular the A/D converters (150, 160).

Figure 2:
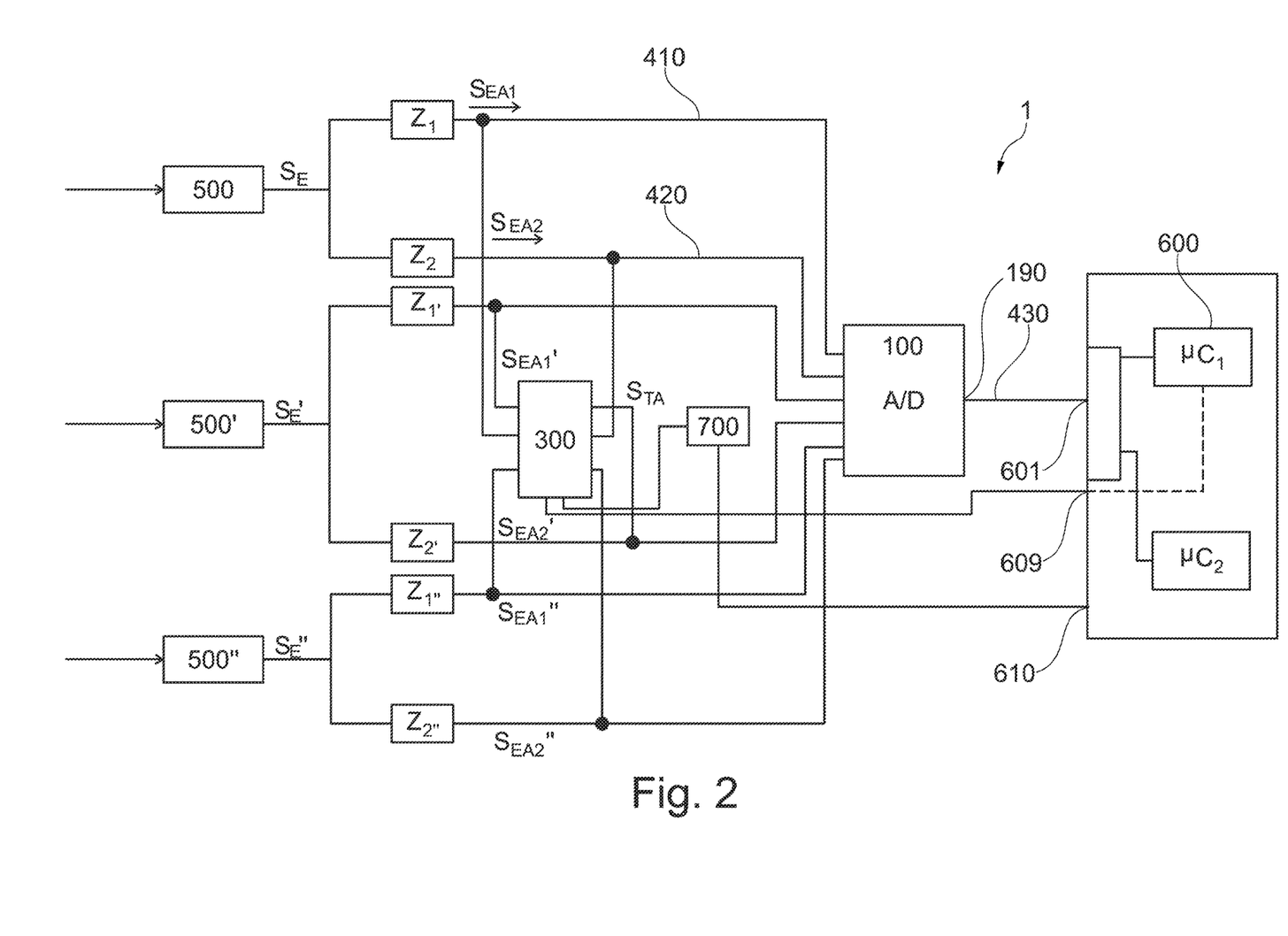
FIG. 2 is a block diagram of a safety circuit of an exemplary embodiment having, by way of example, three sensor signals, a test device, an A/D conversion device and a control and evaluation unit.

FIG. 2 shows a block diagram of the safety circuit 1 of a further exemplary embodiment with for reasons of clarity, for example, 3 input circuits (500, 500', 500") for the independent processing of 3 sensor signals ($S_E$, $S_E'$, $S_E''$).

The A/D conversion device 100 is configured to process a corresponding number of first and second input signals in analog form ($S_{EA1}$, $S_{EA2}$, $S_{EA1}'$, $S_{EA2}'$, $S_{EA1}''$, $S_{EA2}''$).

The A/D conversion device 100, designed for example as a microchip, can include an integrated multiplexer and an A/D converter. The integrated multiplexer can be controlled by one of the microcontrollers μC1 or μC2 and relays the input signal present on the signal lines in analog form $S_{EA1,2}$ and/or the analog test signal $S_{TA}$ to the A/D converter for converting the analog signals ($S_{EA1,2}/S_{TA}$) to input signals in digital form. In addition to testing the correct operation of the A/D converter, it is possible to test the integrated multiplexer, for example, for a short circuit. This is possible because both the input signals of analog type and the analog test signals are routed via the same signal path.

The number of the sensor signals to be processed depends on the number of first and second analog test outputs of the test device 300 (see exemplary embodiment of FIG. 3) and on the number of first and second analog inputs of the A/D conversion device 100.

At the digital output 109 of the A/D conversion device 100, the data is for example made available to the control and evaluation device via an SPI interface (serial peripheral interface). In this case, the data line is (430) suitable for passing the data flow to an input (601) of the control and evaluation device. Thus, the circuit structure as described in the exemplary embodiment of FIG. 2 can produce a test circuit, which can be easily adapted to any number of sensor inputs.

Figure 3:
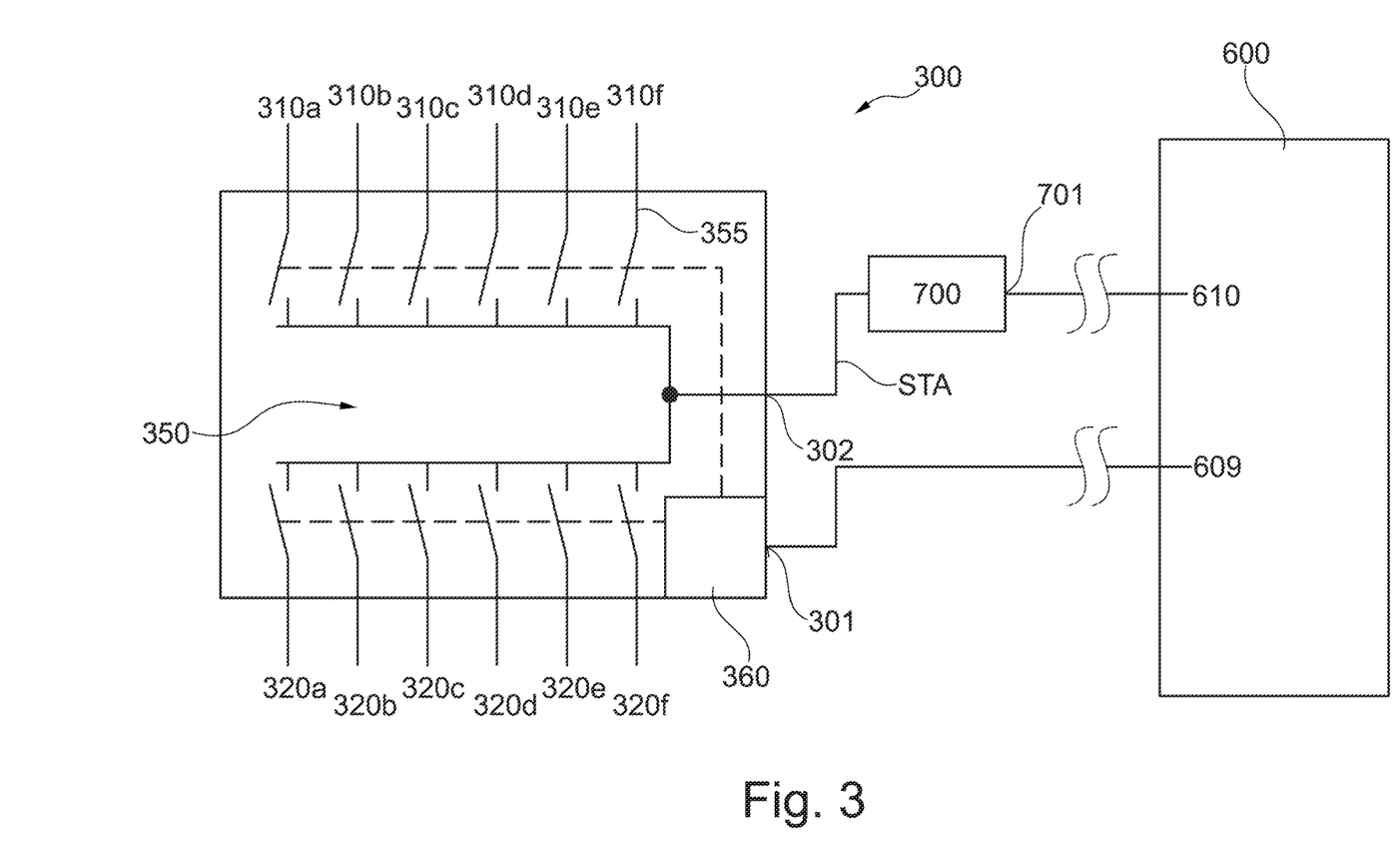
FIG. 3 is a block diagram of a test device having a signal source.

FIG. 3 shows a block diagram of a test device 300 of another exemplary embodiment, designed for example, for 6 sensors. The test device 300 includes a switching device 350 with 12 switches 355, which are independently and individually switchable by a switching logic 360 and can create a conductive connection between the test input 302 and the corresponding first and/or second analog test outputs (310, 320). The switching logic 360 is controlled by a control and evaluation device via the control input 301. The switches 355 are preferably designed as an integrated semiconductor circuit. The test device from FIG. 3 can be realized, for example, by a 6-channel CMOS analog multiplexer. Furthermore, the test device 300 comprises a test input 302 for inputting an analog test signal $S_{TA}$. The analog test signal $S_{TA}$ is generated by a signal source 700.

In the exemplary embodiment of FIG. 3, the signal source 700 is formed as an external component and also has a control input 701. Alternatively, the signal source 700 can be integrated in the test device 300 and be controlled via a switching logic 360. The signal source 700 may be a signal generator or a simple current/voltage source that outputs a constant or variable analog signal. Further, a simple transistor connected to ground is conceivable as the signal source 700. Preferably, the signal source 700 has a voltage or current source which can be set externally, for example, by a processor of a control and evaluation circuit 600 or is designed as such a source. For example, the signal source 700 has a digital-to-analog converter for generating the test signal.

Figure 4A:
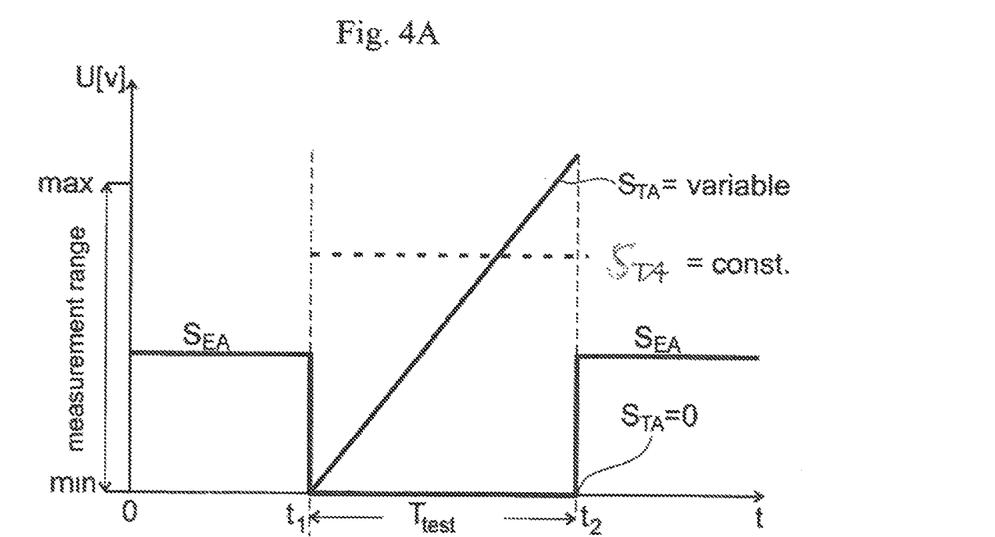
FIG. 4A and FIG. 4B illustrate an exemplary signal path of the test signal and the input signal in analog form.

FIG. 4A shows, for example, a voltage curve (U [V]) at a first or second input 101, 102 of an A/D conversion device 100 as a function of time t, wherein $S_{EA}$ corresponds to an input signal in analog form and $S_{TA}$ corresponds to an analog test signal.

At a time t=0, a first input signal dominates in analog form $S_{EA}$, for example, at the first analog input 101 of the A/D conversion device 100. At time t=$t_1$, the analog test signal $S_{TA}$ is applied via the first analog output 310 of the test device 300 to the first analog input 101 of the A/D conversion device 100 and superposes the input signal in analog form $S_{EA}$ up to the time t=$t_2$. The analog test signal can be constant ($S_{TA}$=const.) or variable. Preferably, the analog test signal traverses the entire measurement range of the A/D converter to determine correct operation.

Figure 4B:
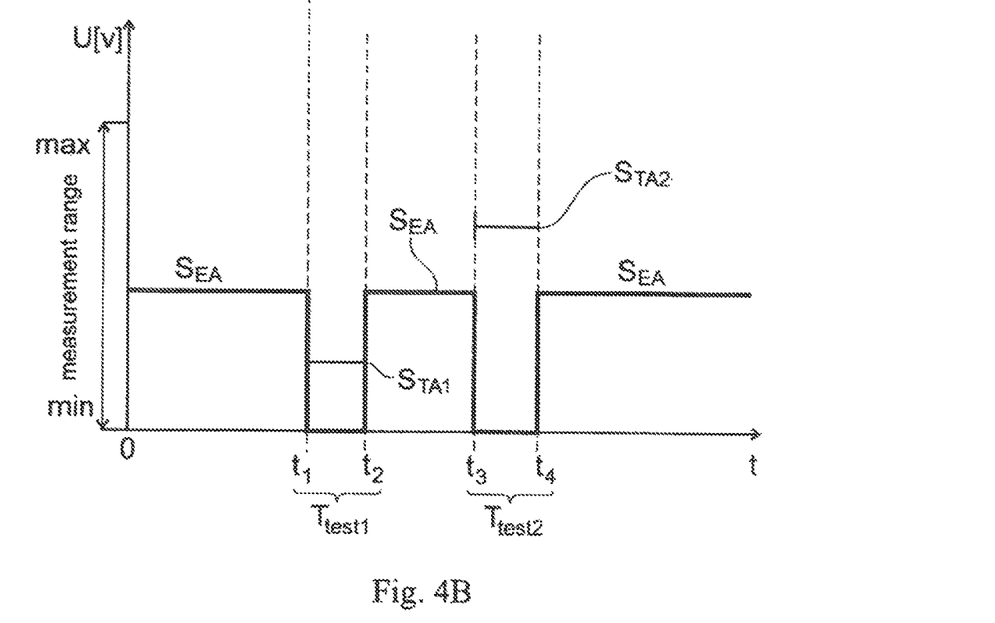

FIG. 4B shows a further example of a voltage curve at an input of an A/D conversion device, wherein two tests ($T_{test1}$, $T_{test2}$) are performed in rapid succession. For example, a first test during a first test period $T_{test1}$ downstream of a voltage of an input signal in analog form with a test signal $S_{TA1}$ and a second test during a second test period $T_{test2}$ upstream of the voltage of the input signal in analog form with a test signal $S_{TA2}$. Here, the duration of a test can be shortened because it is not necessary to pass through the entire measurement range, but only through individual sections of the measurement range in short time intervals.

The safety circuit 1 of the exemplary embodiment of FIG. 1 preferably has at least two operating modes. A first operating mode is normal operation, i.e., the analog signals made available by a sensor are processed in the input circuit 500, provided at the output 501 of the input circuit and relayed via multiple channels, in the present case via two channels, via two signal lines 410 and 420 to the A/D conversion device 100. The A/D conversion device 100 generates corresponding first or second input signals in digital form $S_{1D}$, $S_{2D}$ from the processed first or second input signals in analog form $S_{EA1}$, $S_{EA2}$.

The first or second data in digital form $S_{1D}$, $S_{2D}$ are transmitted via the data line(s) 430, 440 with, for example, a serial bus to the control and evaluation device 600 and are processed with the aid of programs on a processor or by means of the first microcontroller µC1 and/or the second microcontroller µC2. In this case, processing includes, for example, a comparison, which data communicated via the data lines 430 and 440 and/or are compared to their relay, for example, to a superordinate controller (PLC).

A second operating mode is the test operation. In this operating mode, by means of the test device 300 each signal path 410, 420 can be tested for line breakage as well as the transfer characteristic or function of the A/D converter. In addition, it is also possible to check the first and/or second input signal in digital form $S_{1D}$, $S_{2D}$ output by the A/D conversion device 100 against an expected value. Advantageously, the expected value is predetermined by the control and evaluation device 600.

In test mode, a test routine is executed in the form of a program, preferably in the control and evaluation device 600. The test routine can be initiated manually by a user and/or cyclically by the control and evaluation device 600 or by a higher level controller (PLC) and contains a sequence of instructions for controlling parts of the safety circuit, particularly the signal source 700 of the test device 300.

The signal source 700 is driven, for example, by a processor or preferably by one of the microcontrollers µC1 or µC2 for outputting a defined analog test signal $S_{TA}$. This test signal $S_{TA}$ may be a ground potential, a voltage potential, a (temporally) variable voltage potential or a current or variable current (FIG. 4).

The test device 300 according to the exemplary embodiment of FIG. 3, driven by the evaluation and control device 600, controls the switches 355 with the switching logic 360 such that the first signal line 410 is connected via one of the first analog test outputs, for example 310a of the test device 300, with the analog input 302 of the test device 300. The analog test signal $S_{TA}$ superposes the first input signal in analog form $S_{EA1}$ on the signal line 410 and dominates the first input signal in analog form $S_{EA1}$ at the analog input 101 of the A/D conversion device 100, while the first input signal in analog form $S_{EA1}$ is damped by the damping element Z1.

In the simplest case, the amplitude of the first input signal in analog form is changed, in particular reduced, during damping.

The A/D conversion device 100 in the exemplary embodiment of FIG. 1 converts the analog test signal $S_{TA}$, for example, to a first input signal in digital form $S_{1D}$. The evaluation and control unit 600 checks the first input signal in digital form $S_{1D}$ against an expected value that corresponds to the digitized analog test signal $S_{TA}$. If the values match, it can be assumed that the analog-to-digital conversion in the A/D conversion device 100, the corresponding signal and data lines, and the data interface are without errors.

This test can also be performed for the second signal line 420. Advantageously, the tests can be performed in a time sequence, for example, one after the other, so that the signals $S_E$ output by the sensor can continue to be processed by the control and evaluation unit 600 without an interruption of the running process.

FIG. 4 shows a diagram with a signal path in dependence on time that, for example, is present at the first analog input (101) of the A/D conversion device (100).

The input signal in analog form $S_{EA}$ is superposed by the analog test signal $S_{TA}$ at time $t_1$, the start of the test period $Tt_{est}$, wherein the analog test signal $S_{TA}$ in its simplest embodiment satisfies the following condition $S_{TA}$>0 and $S_{TA}$>$S_{EA}$. The test period is defined by the time interval $Tt_{est}$=$t_2$−$t_1$. The analog test signal $S_{TA}$ may be a time-constant signal, for example a voltage potential, a ground potential ($S_{TA}$=0) or else a constant current signal. However, it is also conceivable that the analog test signal $S_{TA}$ is a variable voltage potential or a variable current, wherein variable in this context may be, for example, a course of the analog test signal that is temporally altered over the test period $T_{test}$. It is particularly advantageous that in this test, the entire value range of the A/D conversion device is run through and thus can be tested.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A safety circuit, comprising:
   an input circuit adapted to input a first input signal and a second input signal and provide the first input signal and the second input signal at an output;
   an A/D converter having a first analog input and a second analog input and a digital output;
   a first signal line connected to the output of the input circuit and to the first analog input of the A/D converter to relay the first input signal, from the input circuit, in analog form, wherein the A/D converter device is configured to convert the first input signal in analog form at the first analog input to a first input signal in digital form and to output the first input signal in digital form at the digital output;
   a second signal line connected to the output of the input circuit and to the second analog input of the A/D converter to relay the second input signal, from the input circuit, in analog form, wherein the A/D converter is arranged to convert the second input signal in analog form at the second analog input to a second input signal in digital form and to output the second input signal in digital form at the digital output;
   a control and evaluation device for evaluating the first input signal in digital form and the second input signal in digital form, wherein the digital output of the A/D converter is connected to at least one input of the control and evaluation device; and
   a test device to output an analog test signal, wherein the test device has a control input which is connected to a control output of the control and evaluation device and wherein the control and evaluation device is further configured to control the test device,
   wherein the test device has a first analog test output to output the analog test signal, the first analog test output being connected to the first signal line and the test device has a second analog test output to output the analog test signal, the second analog test output being connected to the second signal line.

2. The safety circuit according to claim 1, wherein the test device has a test input for the input of the analog test signal,
   wherein at least during a test period, the analog test signal is applied,
   wherein a signal source is connected to the test input and
   wherein the signal source is adapted to generate the analog test signal via a voltage or current source.

3. The safety circuit according to claim 1, wherein the analog test signal is a ground potential or a constant voltage potential or a variable voltage potential.

4. The safety circuit according to claim 1, wherein the analog test signal is a constant or a variable current.

5. The safety circuit according to claim 1, wherein the analog test signal follows a predetermined or predeterminable signal path during the test period.

6. The safety circuit according to claim 1, wherein the test device has a switching device, wherein the switching device is set up to switch the analog test signal to the first analog test output and/or to the second analog test output.

7. The safety circuit according to claim 6, wherein the switching device has at least two switches, wherein the switches are controlled individually and/or in groups.

8. The safety circuit according to claim 1, wherein the first signal line comprises a first damping element so that the input circuit with an interposition of the first damping element is connected to the first analog input of the A/D converter, and wherein the second signal line comprises a second damping element so that the input circuit with an interposition of the second damping element is connected to the second analog input of the A/D converter.

9. The safety circuit according to claim 8, wherein the first damping element, the second damping element and an output impedance of the test device and/or the signal source are configured such that the first input signal in analog form and the analog test signal are superposed during the test period at the first analog input of the A/D conversion device and/or wherein the second input signal in analog form and the analog test signal during the test period are superposed at the second analog input of the A/D conversion device such that the analog test signal dominates the first input signal in analog form or the second input signal in analog form.

10. The safety circuit according to claim 1, wherein the control and evaluation device has a processor for processing the first input signal in digital form and/or the second input signal in digital form.

11. The safety circuit according to claim 1, wherein the A/D converter comprises a first A/D converter and a second A/D converter, wherein the first A/D converter is configured to convert the first input signal in analog form to the first input signal in digital form and to output it at the digital output and wherein the second A/D converter is configured to convert the second input signal in analog form to the second input signal in digital form and to output it at the digital output.

12. The safety circuit according to claim 1, wherein the test device further comprises:
    a multiplexer having a controllable logic; and
    a switching device having a plurality of switches configured to be independently switched.

13. The safety circuit according to claim 1, wherein the test device is configured to output a continuous analog signal as the analog test signal.

14. A method for testing a safety circuit, the method comprising:
    providing a signal source for generating an analog test signal; and
    outputting the analog test signal, from a test device to a first and/or a second signal line,
    connecting, during a test period, the analog test signal applied to a test input of the test device via a switching device,
    replacing the analog test signal with a first input signal in analog form at the first analog input of an A/D converter and/or replacing the analog test signal with a second input signal in analog form at the second analog input of the A/D converter.

15. The method according to claim 14, wherein, during the test period, via the test device the first input signal in analog form is superposed with the analog test signal such that the analog test signal dominates at the first analog input of the A/D converter and/or wherein the second input signal in analog form is superposed with the analog test signal such that the analog test signal dominates at the second analog input of the A/D converter.

16. The method according to claim 14, wherein the analog test signal is changed by automatically following a predetermined or predeterminable signal path.

17. The method according to claim 14, wherein a control and evaluation device, during the test period checks the analog test signal output by the test device at the first analog input of the A/D converter and/or at the second analog input of the A/D converter for against an expected value and triggers an error signal of an event of a disparity.

* * * * *